United States Patent
Ikeda et al.

(10) Patent No.: US 8,848,444 B2
(45) Date of Patent: Sep. 30, 2014

(54) SIGNAL TRANSMISSION SYSTEM AND STORAGE SYSTEM

(71) Applicant: Hitachi, Ltd., Tokyo (JP)

(72) Inventors: Yasuhiro Ikeda, Fujisawa (JP); Yutaka Uematsu, Kawasaki (JP); Satoshi Muraoka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/702,732

(22) PCT Filed: Oct. 23, 2012

(86) PCT No.: PCT/JP2012/006759
§ 371 (c)(1),
(2), (4) Date: Dec. 7, 2012

(87) PCT Pub. No.: WO2014/064732
PCT Pub. Date: May 1, 2014

(65) Prior Publication Data
US 2014/0112073 A1  Apr. 24, 2014

(51) Int. Cl.
*G11C 16/04* (2006.01)
*G11C 8/18* (2006.01)
*G11C 16/06* (2006.01)
*G06F 13/42* (2006.01)
*G06F 12/02* (2006.01)
*G11C 7/22* (2006.01)

(52) U.S. Cl.
CPC .. *G11C 7/22* (2013.01); *G11C 8/18* (2013.01); *G11C 16/06* (2013.01); *G06F 13/4243* (2013.01); *G06F 12/0246* (2013.01)
USPC ................................. 365/185.11; 365/185.33

(58) Field of Classification Search
USPC ......................................... 365/185.11, 185.33
See application file for complete search history.

(56) References Cited

U.S. PATENT DOCUMENTS 5,822,251 A * 10/1998 Bruce et al. .............. 365/185.33
8,312,240 B2 * 11/2012 Takemae ........................ 711/167
2005/0286284 A1  12/2005 See et al.

FOREIGN PATENT DOCUMENTS

JP   2000-46921   2/2000

OTHER PUBLICATIONS

International Search Report for International application No. PCT/JP2012/006759, issued on May 14, 2013 and associated papers.

* cited by examiner

*Primary Examiner* — Huan Hoang
(74) *Attorney, Agent, or Firm* — Antonelli, Terry, Stout & Kraus, LLP.

(57) ABSTRACT

A signal transmission system is provided which connects a memory controller and a plurality of semiconductor memories. The signal transmission system comprises a semiconductor device arranged between the memory controller and the plurality of memories, in which: the semi-conductor device comprises a control circuit; and the control circuit receives a signal from the semiconductor memory and outputs a control signal to the memory controller in response to the signal from the semiconductor memory.

15 Claims, 10 Drawing Sheets

(Related art)

SIGNAL TRANSMISSION SYSTEM AND STORAGE SYSTEM

TECHNICAL FIELD

The present invention relates to a signal transmission system and a storage system including the signal transmission system.

BACKGROUND ART

In recent years, there is a growing need for a large-capacity storage system using a low-cost and high-density flash memory. To realize the large-capacity storage system, it is considered that more flash memories are connected. However, if more flash memories are connected, a signal (CE#) to select a chip and a signal (R/B#) to notify an operation state of the chip increase. When the numbers of these signals increase, signal lines of these signals increase and the number of pins in a memory controller increases. As a result, the package size becomes large and the cost becomes high.

Therefore, a configuration to reduce signal lines in a semiconductor device is required. The related art of the present technical field includes Patent Literature 1. Patent Literature 1 describes that "A semiconductor device comprises both a mode signal generating circuit 11 to generate a plurality of mode signals M0 to M2 corresponding to the operation modes of the semiconductor device, and a test signal generating circuit 12 to generate a plurality of test signals T0 to T2 for testing the semiconductor device in the operation modes corresponding to the generated mode signals M0 to M2. The semiconductor device transmits each of the mode signals M0 to M2 and the test signals T0 to T2 to predetermined regions via a plurality of signal conductors. In this case, an encoder circuit 16 to encode the mode signals M0 to M2 and the test signals T0 to T2, and to supply them to the signal conductors as encode signals S0 to S3 with the number of bits fewer than the sum of the number of bits of both the mode signals M0 to M2 and the test signals T0 to T2, is arranged" (see Abstract).

CITATION LIST

Patent Literature

PTL 1: JP Patent Publication (Kokai) No. 2000-46921

SUMMARY OF INVENTION

Technical Problem

In above Patent Literature 1, although the mode signals and the test signals are encoded to reduce signal lines for these signals, in this configuration, a reduction effect of signal lines, that is, the number of pins in a memory controller is small. Also, in Patent Literature 1, the mode signals and the test signals are targeted, but a signal (CE#) to select a chip and a signal (R/B#) to notify an operation state of the chip are not considered.

The present invention provides a signal transmission system that can reduce the number of pins in a memory controller, and a storage system including the signal transmission system.

Solution to Problem

To solve the above problem, for example, a configuration recited in the claims is adopted. Although the present application includes a plurality of means to solve the above problem, as an example, a signal transmission system connecting a memory controller and a plurality of semiconductor memories includes a semiconductor device arranged between the memory controller and the plurality of semiconductor memories, in which the semiconductor device includes a control circuit; and the control circuit receives a signal from the semiconductor memory and outputs a control signal to the memory controller in response to the signal from the semiconductor memory.

Also, according to another example, a storage system is provided which includes a storage controller and a storage device group including a plurality of semiconductor memory packages. In this storage system, the semiconductor memory package includes a semiconductor memory control unit, a plurality of semiconductor memories and a semiconductor device arranged between the semiconductor memory control unit and the plurality of semiconductor memories. Also, the semiconductor device includes a control circuit, and the control circuit receives a signal from the semiconductor memory and outputs a control signal to the semiconductor memory control unit in response to the signal from the semiconductor memory.

Advantageous Effects of Invention

According to the present invention, it is possible to reduce the number of pins in a memory controller. By this means, the occupation area of signal lines in a board becomes small and it is possible to realize high-density mounting.

Further features related to the present invention are clarified from description of the present specification and the accompanying drawings. Also, other problems, configurations and advantages than the above will be clarified in the following explanation of examples.

DESCRIPTION OF EMBODIMENTS

In the following, examples of the present invention will be explained with reference to the accompanying drawings.

Also, although the accompanying drawings illustrate specific examples based on the principle of the present invention, these are used to understand the present invention and are never used to interpret the present invention in a limited manner.

Also, in the following examples, "CE#" denotes a chip enable signal to select a chip. Also, "R/B#" denotes a ready busy signal to notify a chip operation state. Also, "DQ" denotes a data signal.

Example 1

Figure 1:
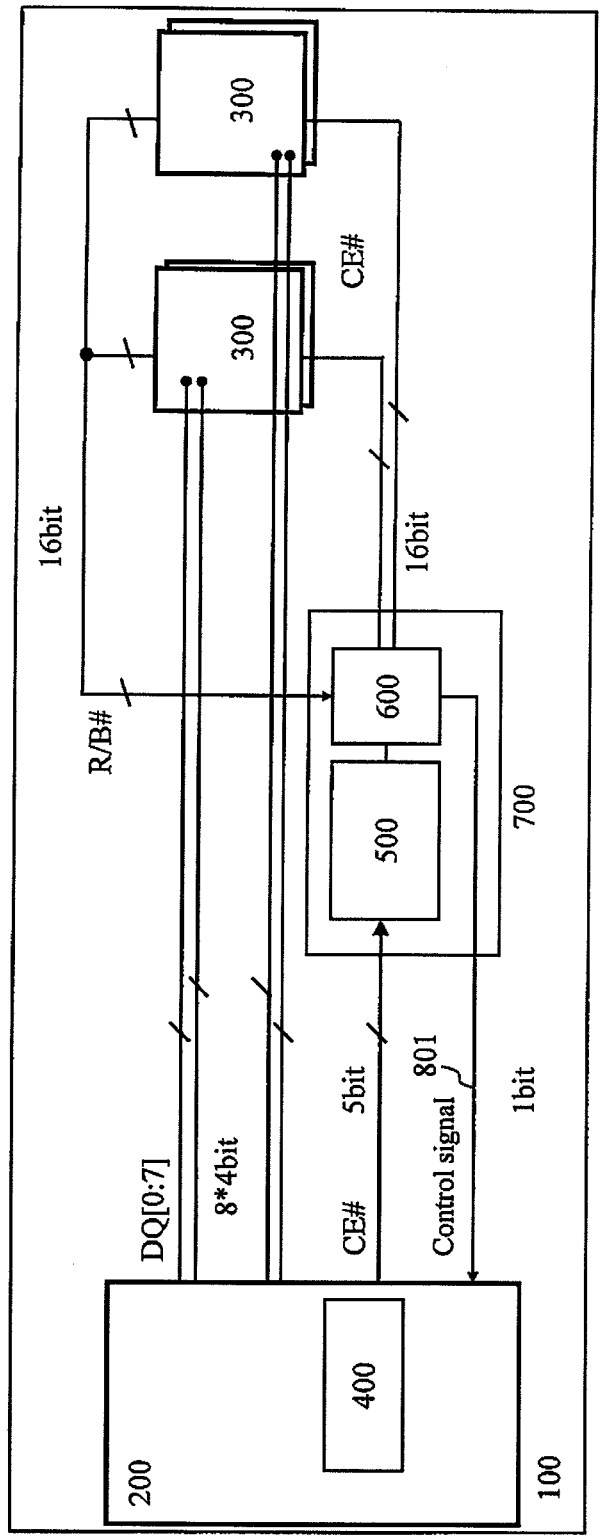
FIG. 1 is an example of a configuration of a signal transmission system according to Example 1 of the present invention.

FIG. 1 illustrates an example of a configuration of a signal transmission system according to the present example mounted on a board. On a board 100, a memory controller 200 and a plurality of flash memories (i.e. semiconductor memories) 300 are provided. In the present example, four flash memories 300 are arranged on the board 100. Also, in the present example, although four flash memories are connected to one memory controller, it is not limited to this configuration, and a configuration is possible in which the memory controller 200 and the flash memory 300 are connected at a ratio of 1 to n (arbitrary number). Also, the flash memory 300 includes a plurality of chips. In the present example, for example, each flash memory 300 includes eight chips.

The present example provides a signal transmission system connecting between the memory controller 200 and the flash memory 300. A CE# signal denotes a signal for selecting a chip of the flash memory 300 and an R/B# signal denotes a signal for notifying an operation state (i.e. busy state) of the chip of the flash memory 300. Also, in the present example, a case is assumed where 16-bit CE# signals and 16-bit R/B# signals are required.

Also, in FIG. 1, DQ[0:7] indicates 0th to 7th data signals, that is, it means that there are eight signal lines of DQ signals. In the present example, there are four sets of eight signal lines of DQ signals in association with each flash memory 300, and therefore there are 32-bit (8×4) signal lines of DQ signals.

In the following, an example will be explained with respect to a signal transmission system to reduce the number of pins for a CE# signal to select a chip and the number of pins for an R/B# signal to notify an operation state of the chip in the memory controller 200.

The memory controller 200 includes an encode circuit 400 that encodes the CE# signal. The encode circuit 400 encodes the CE# signal and outputs the encoded CE# signal (5 bits). The breakdown of this 5-bit signal is explained, and 4 bits are used as a signal to select a chip of 16 bits and 1 bit is used as a signal not to select a chip (i.e. all off).

The board 100 includes a semiconductor device 700 provided between the memory controller 200 and the flash memory 300. The semiconductor device 700 includes a decode circuit 500 that decodes the CE# signal encoded by the encode circuit 400, and a control circuit 600 that receives the R/B# signal from the flash memory 300 and outputs a control signal 801 to the memory controller 200. The control signal 801 denotes a 1-bit signal indicating whether a chip selected by the CE# signal is in a busy state. That is, the control circuit 600 detects whether the chip selected by the CE# signal is in a busy state. The memory controller 200 can know by the control signal 801 whether the chip selected by the CE# signal is in a busy state, and can control re-transmission of the CE# signal.

Figure 2:
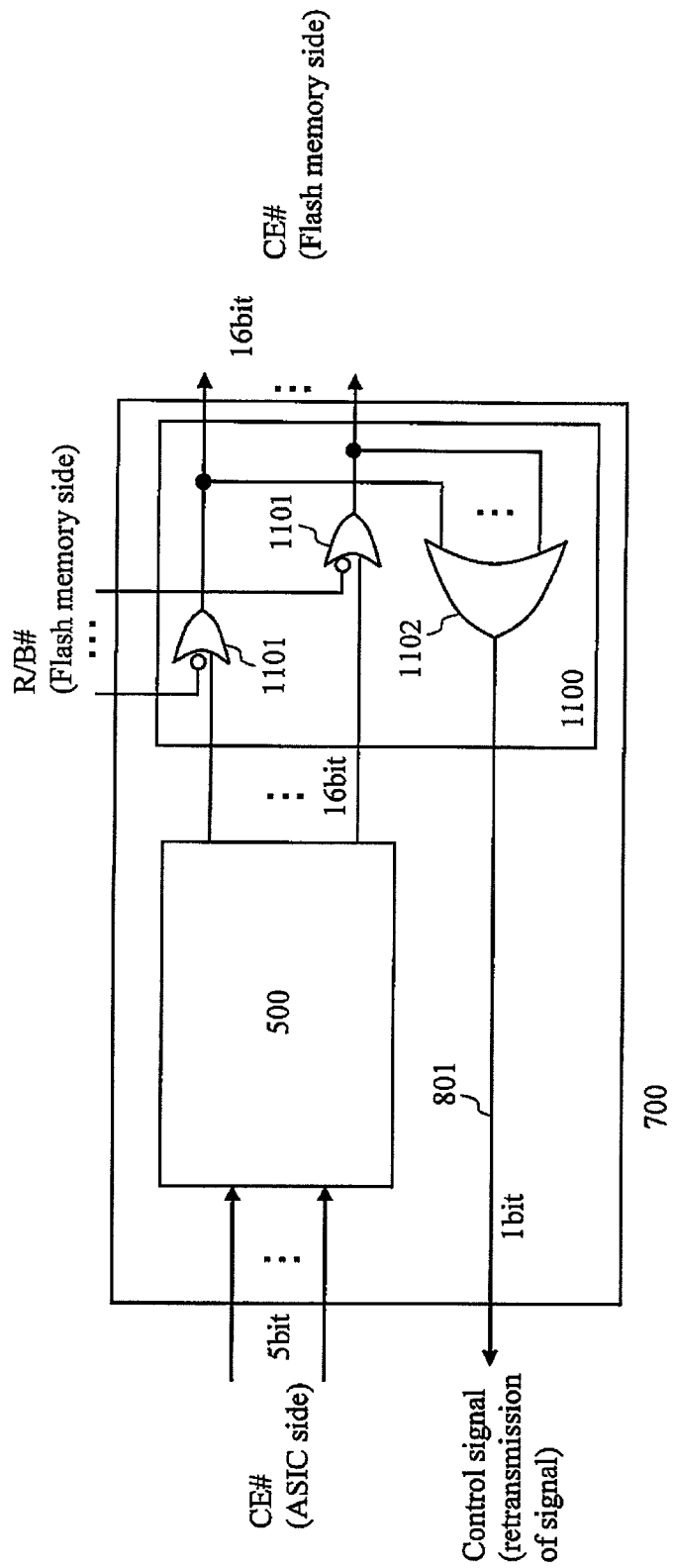
FIG. 2 is an example of a configuration of a control circuit according to Example 1 of the present invention.

FIG. 2 is a view illustrating an example of a control circuit. Although there are various possible realization configurations of the control circuit 600 in FIG. 1, as an example, a circuit 1100 that masks the CE# signal by the R/B# signal is possible.

The circuit 1100 includes a plurality of first OR circuits 1101 and a second OR circuit 1102. The decode circuit 500 decodes the 5-bit signal encoded by the encode circuit 400 and acquires 16-bit CE# signals. Each of 16-bit CE# signals is input to the first OR circuit 1101. Also, although it is omitted in FIG. 2, actually, signal lines of 16-bit CE# signals extend from the decode circuit 500 and the first OR circuit 1101 is arranged every signal line of the CE# signal. Also, the R/B# signal corresponding to a chip selected by the CE# signal is input to the first OR circuit 1101 as a NOT input. By this means, in a case in which the chip is in a busy state, the CE# signal is not transmitted to the flash memory 300 and it is possible to control the CE# signal using the R/B# signal.

Also, outputs of the first OR circuits 1101 are each input to the second OR circuit 1102. Subsequently, an output of the second OR circuit 1102 is output to the memory controller 200 as the control signal 801. Thus, an OR computation of the CE# signal and the R/B# signal corresponding to a chip selected by the CE# signal is performed in the first OR circuits 1101 and the outputs of the first OR circuits 1101 are subjected to OR computation in the second OR circuit 1102 to output the control signal 801. By this means, the circuit 1100 can output, as the control signal 801, a decision as to whether the chip selected by the CE# signal is in a busy state. By this means, the memory controller 200 can know by the control signal 801 whether the chip selected by the CE# signal is in a busy state.

Also, a configuration of the control circuit 600 is not limited to the above circuit 1100 and may be realized by a different configuration as long as it is possible to detect by the configuration whether a selected chip is in a busy state. Also, a configuration of controlling the CE# signal using the R/B# signal may be realized by other configurations.

Figure 3:
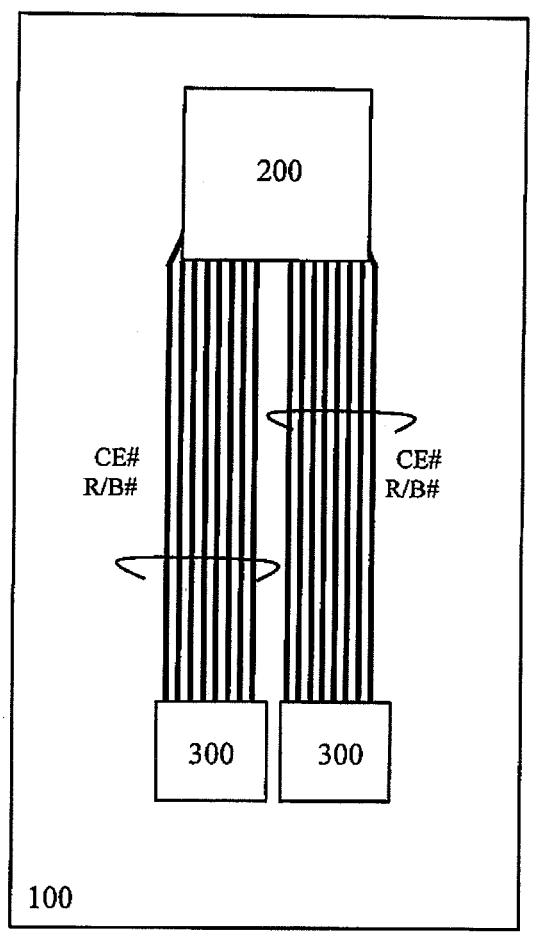
FIG. 3 is a view for explaining signal lines of a signal transmission system in the related art.
Figure 4:
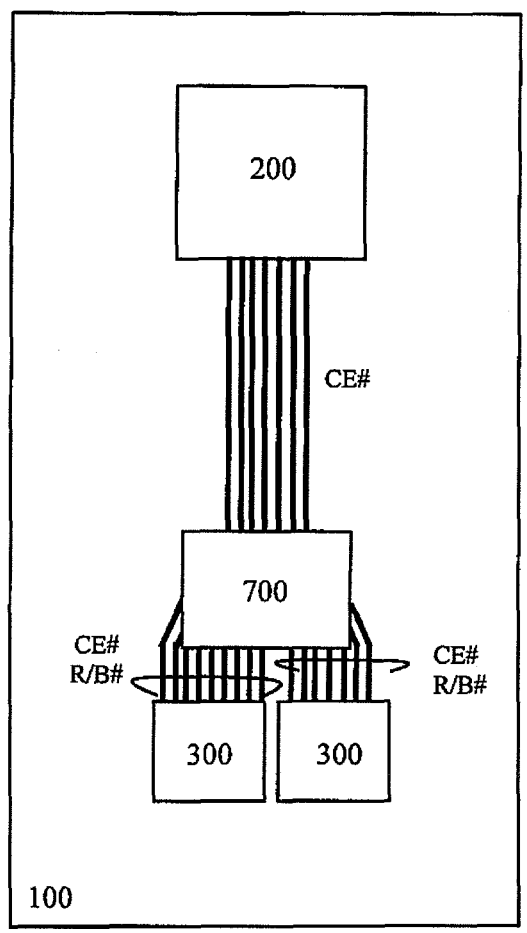
FIG. 4 is a view for explaining signal lines of a signal transmission system in a case in which Example 1 of the present invention is applied.

FIG. 3 illustrates signal lines in a memory controller in the related art and FIG. 4 illustrates signal lines in a case in which the present example is applied. As illustrated in FIG. 3, in the related art, signal lines of both CE# signals and R/B# signals are connected from the memory controller 200 to the flash memories 300. According to the present example, as illustrated in FIG. 4, only signal lines of CE# signals are connected from the memory controller 200 to the semiconductor device 700. Also, since signal lines of R/B# signals from the flash memories 300 are connected to the semiconductor device 700, it is possible to reduce the signal lines of R/B# signals input in the memory controller 200, and, as a result, it is possible to reduce pins for the R/B# signals in the memory controller 200. Therefore, by applying the present example, since it is possible to reduce the number of signal lines, the occupation area of signal lines in the board 100 becomes small and it is possible to realize high-density mounting. Also, it is possible to use an available pin in the memory controller 200 as a pin for a connector power source or a grand pin, and it is possible to improve signal quality.

Figure 5:
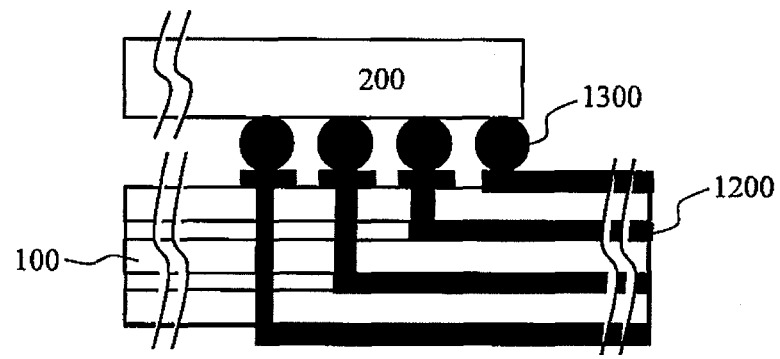
FIG. 5 is a view for explaining a board line layer in a signal transmission system in the related art.
Figure 6:
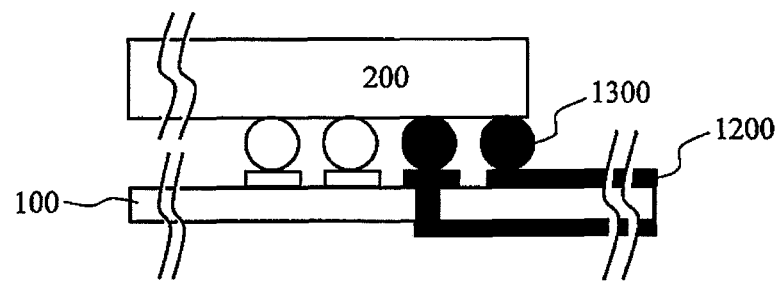
FIG. 6 is a view for explaining a board line layer in a case in which Example 1 of the present invention is applied.

FIG. 5 illustrates a board configuration in the related art and FIG. 6 illustrates a board configuration in a case in which the present example is applied. In a case in which signal lines 1200 of various signals extend from the memory controller 200, the memory controller 200 and the signal lines (i.e. wires) 1200 are connected by soldering balls 1300 and the signal lines 1200 are formed in a layered manner as wire layers. As illustrated in FIG. 3, in the related art, signal lines of both CE# signals and R/B# signals are connected from the memory controller 200 to the flash memories 300. Therefore, as illustrated in FIG. 5, the layer number of wire layers in the board 100 increases. Meanwhile, according to the present example, as illustrated in FIG. 4, it is possible to reduce signal lines of R/B# signals input in the memory controller 200. Therefore, as illustrated in FIG. 6, it is possible to reduce the layer number of wire layers of the board 100 and realize a lower cost of the board 100.

As described above, according to the present example, by encoding CE# signals, it is possible to reduce the number of CE# signals output from the memory controller 200, and, furthermore, it is possible to receive R/B# signals output from the flash memories 300 by the semiconductor device 700 and realize control of the CE# signals. For example, the circuit 1100 in FIG. 2 masks a CE# signal using an R/B# signal. In the circuit 1100, in a case in which a chip of the flash memory 300 is in a busy state, a CE# signal is not transmitted to the flash memory 300. Also, by the control signal 801, the circuit 1100 reports to the memory controller 200 that a selected chip is in a busy state, and thereby it is possible to control CE# signals.

In the present example, signal lines of R/B# signals from the flash memories 300 are connected to the semiconductor device 700. As illustrated in FIG. 4, since the signal lines of R/B# signals need not be connected to the memory controller 200, it is possible to drastically reduce the number of pins required in the memory controller 200. Alternatively, by reducing the number of pins required in the memory controller 200 with respect to memory buses, it is possible to control more memory buses in the memory controller 200. As a result, it is possible to realize high performance (i.e. throughput improvement) in a signal transmission system.

Also, in a signal transmission system connecting the memory controller 200 and the flash memories 300, by reducing the number of pins for a CE# signal to select a chip and the number of pins for an R/B# signal to notify an operation state of the chip, it is possible to realize a low cost of the memory controller 200 and high-density mounting. In the following, a specific reduction number of pins will be illustrated.

In the present example, a case is assumed where four flash memories 300 are mounted on the board 100 and 16-bit CE# signals and 16-bit R/B# signals are required. In this case, the number of pins for the CE# signals and R/B# signals in the memory controller 200 is 32 pins. In the present example, to encode the CE# signals in the memory controller 200, it is possible to reduce 16 pins for the CE# signals to 5 pins (4 pins (16-bit selection)+1 pin (for all-pins off)). Furthermore, the R/B# signals output from the flash memories 300 are input to the semiconductor device 700 and the CE# signals are subjected to mask processing by the R/B# signals. Also, in the memory controller 200, a 1-bit signal line (i.e. signal line of the control signal 801) for reporting a result of the mask processing is connected. That is, it is possible to reduce 16 pins for the R/B# signals to 1 pin. As described above, the number of pins required for the CE# signals and R/B# signals is reduced from 32 pins to 6 pins, that is, it is possible to reduce the number of required pins by about 80%.

Also, the present example is a more preferable embodiment, and, as a variation example, it is possible to form the present invention by removing part of the configuration explained above. In the present example, to reduce the number of pins required for CE# signals, the memory controller 200 includes the encode circuit 400 that encodes the CE# signals, and the semiconductor device 700 includes the decode circuit 500. For example, it is possible to form the present invention by removing these encode circuit 400 and decode circuit 500. To reduce the number of pins required in the memory controller 200, the signal transmission system may include at least the control circuit 600 that detects whether a chip selected by a CE# signal is in a busy state.

Example 2

Figure 7:
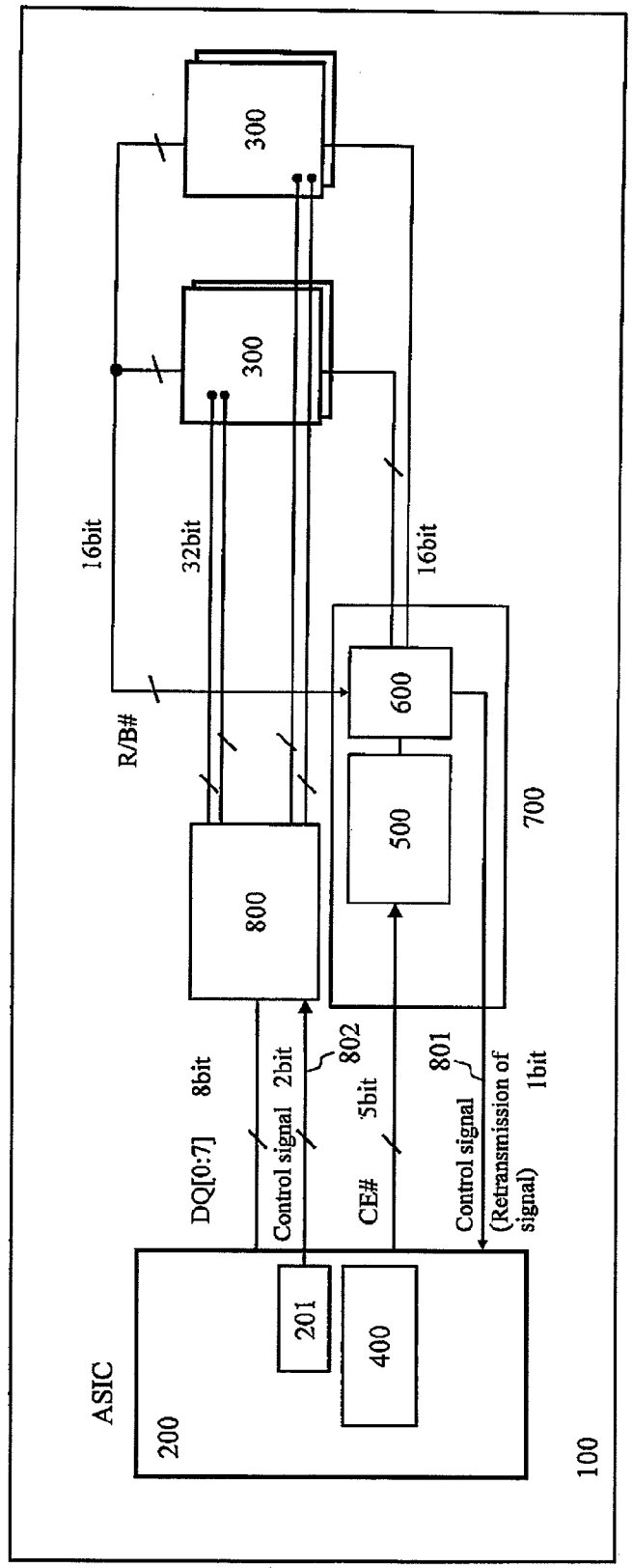
FIG. 7 is an example of a configuration of a signal transmission system according to Example 2 of the present invention.

FIG. 7 illustrates an example of a configuration diagram of a signal transmission system according to the present example mounted on a board. Here, in Example 2, the same reference numerals are assigned to the same components as in the above example and their explanation will be omitted. In the following, only different parts from the configuration in Example 1 will be explained.

In the present example, a switch circuit 800 is arranged between the memory controller 200 and the flash memories 300. The switch circuit 800 is a circuit that switches DQ signals. In the present example, 8-bit signal lines of DQ signals are connected from the memory controller 200 to the switch circuit 800. Also, 32-bits (8×4) signal lines of DQ signals are connected from the switch circuit 800 to the flash memories 300.

The memory controller 200 includes a circuit 201 that outputs a control signal 802 to control a switch in the switch circuit 800. Also, 2-bit signal lines of the control signal 802 are connected from the memory controller 200 to the switch circuit 800. Therefore, by the control signal 802, it is possible to control which signal line of DQ signal is selected in the switch circuit 800.

According to the present example, by providing the switch circuit 800 between the memory controller 200 and the flash memories 300, it is possible to reduce the number of pins for DQ signals in the memory controller 200. To be more specific, it is possible to reduce 32 pins for DQ signals to 10 pins (8 bits (for DQ signals)+2 bits (for the control signal 802)). Thus, by reducing the number of pins for DQ signals in the memory controller 200, it is possible to further enhance the advantage of Example 1.

Example 3

Figure 8:
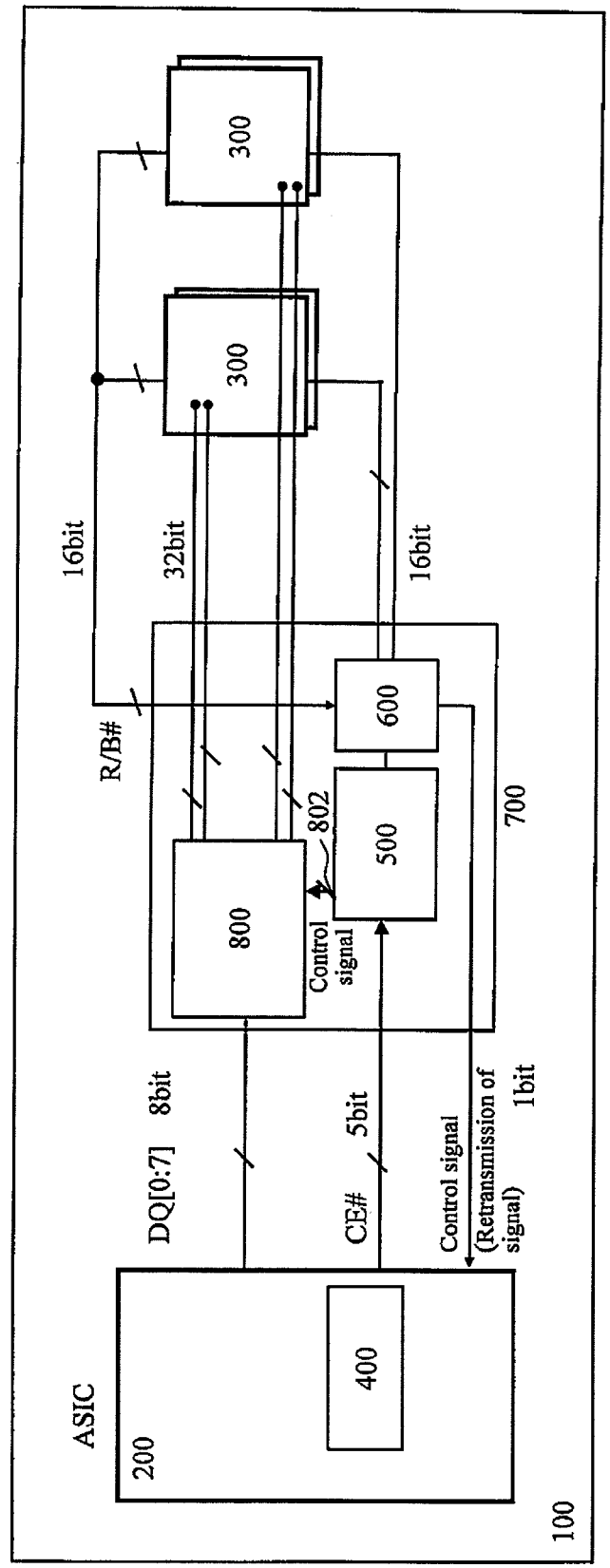
FIG. 8 is an example of a configuration of a signal transmission system according to Example 3 of the present invention.

FIG. 8 illustrates an example of a configuration of a signal transmission system according to the present example mounted on a board. Here, in Example 3, the same reference numerals are assigned to the same components as in the above example and their explanation will be omitted. In the following, only different parts from the configuration in Example 2 will be explained.

In the present example, the switch circuit 800 is mounted inside the semiconductor device 700. A feature of Example 3 lies in generating the control signal 802 for controlling the switch circuit 800, in the semiconductor device 700 instead of the memory controller 200.

Although there are various methods of implementing a circuit that generates a control signal for controlling the switch circuit 800 in the semiconductor device 700, as an example, there is a possible circuit that generates the control signal 802 using a CE# signal. Since the CE# signal indicates which chip of the flash memory 300 is selected, it is possible to use the CE# signal.

For example, the semiconductor device 700 includes four OR circuits between the decode circuit 500 and the switch circuit 800. Regarding 16-bit CE# signals output from the decode circuit 500, 4-bit CE# signals to select the identical flash memory 300 are input to the identical OR circuit and the output of each OR circuit is input to the switch circuit 800. According to this configuration, using CE# signals, it is possible to report which flash memory 300 is selected, to the switch circuit 800. That is, it is possible to use outputs of the OR circuits as the control signal 802 to control the switch circuit 800. Also, a configuration of generating a control signal in the semiconductor device 700 is not limited to the above configuration and may be realized by other configurations.

According to the present example, it is possible to reduce the number of pins for control signals for the switch circuit 800 in the memory controller 200. Also, since it is possible to implement the decode circuit 500, the control circuit 600 and the switch circuit 800 on one semiconductor device 700, compared to a case in which these are separately mounted, it is possible to reduce a mounting space on the board 100.

Example 4

Figure 9:
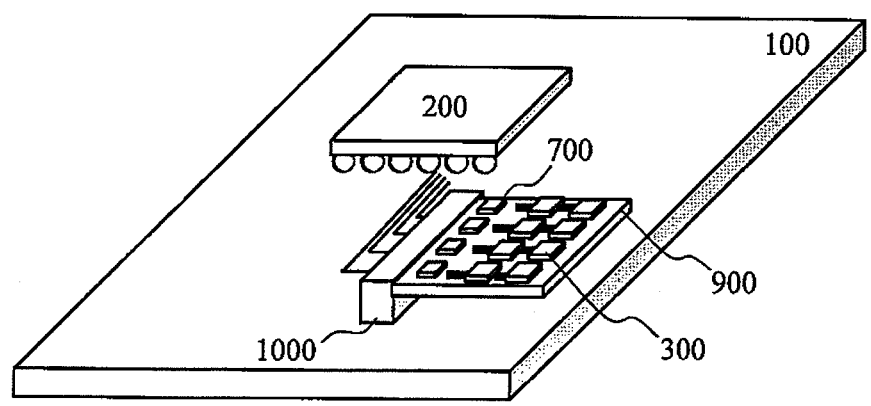
FIG. 9 is an example of a configuration of a signal transmission system according to Example 4 of the present invention.

FIG. 9 illustrates an example of a configuration in which a flash memory and a semi-conductor device are mounted on a DIMM board and a memory controller is mounted on a board. Here, in Example 4, the same reference numerals are assigned to the same components as in the above examples and their explanation will be omitted.

On the board 100, a DIMM board 900 is connected via a DIMM connector 1000. Also, the flash memory 300 and the semiconductor device 700 are mounted on the DIMM board 900. Also, the memory controller 200 is mounted on the board 100. A feature of Example 4 lies in supporting variation in the memory capacity by changing the DIMM board 900. Furthermore, by mounting the semiconductor device 700 on the DIMM board 900, it is possible to reduce the number of pins required for signals of the DIMM connector 1000. Also, it is also possible to use an available pin as a pin for the power source of the DIMM connector 1000 or a grand pin, and it is possible to improve signal quality.

Example 5

Figure 10:
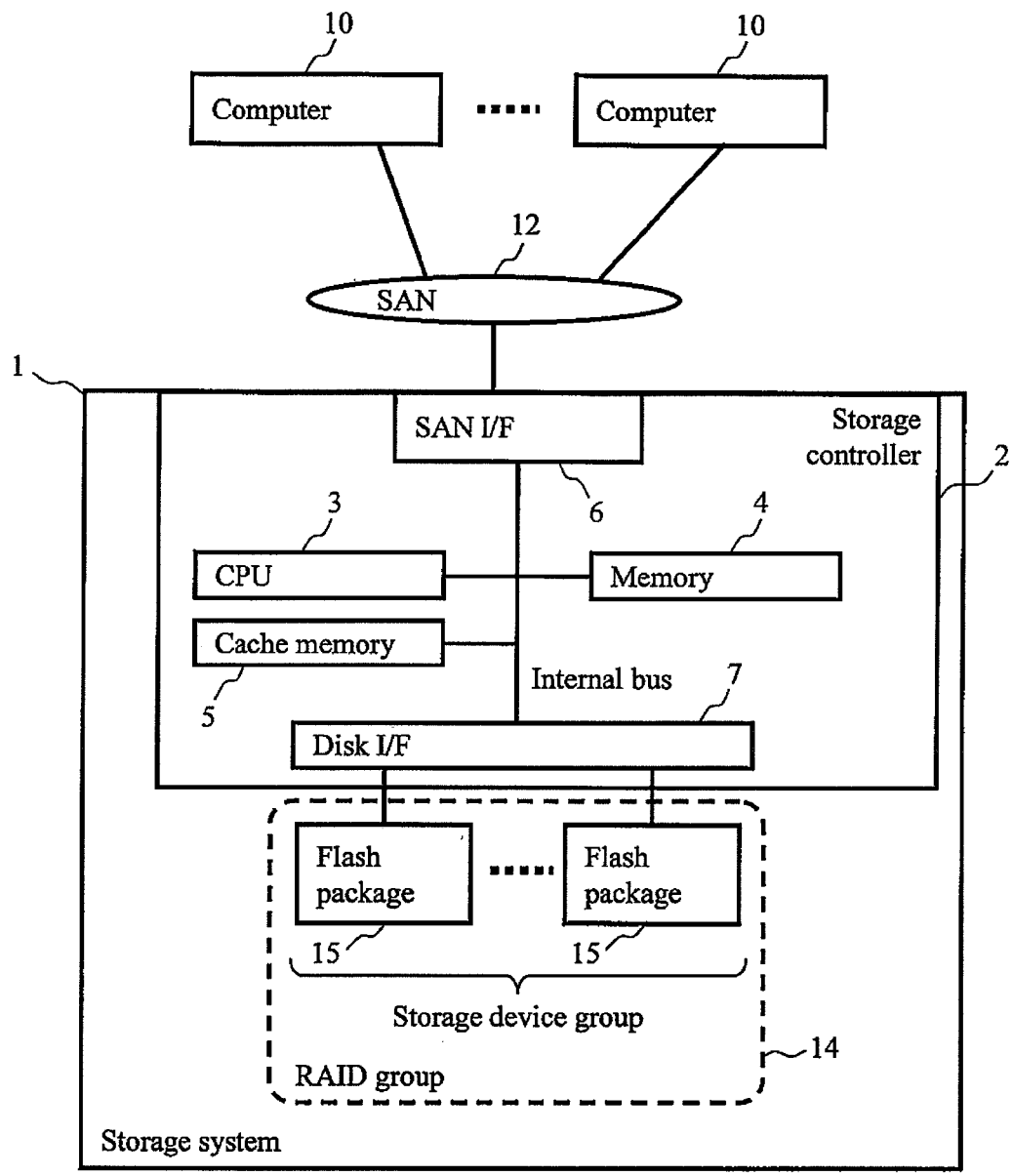
FIG. 10 is an overall view of a storage system according to Example 5 of the present invention.
Figure 11:
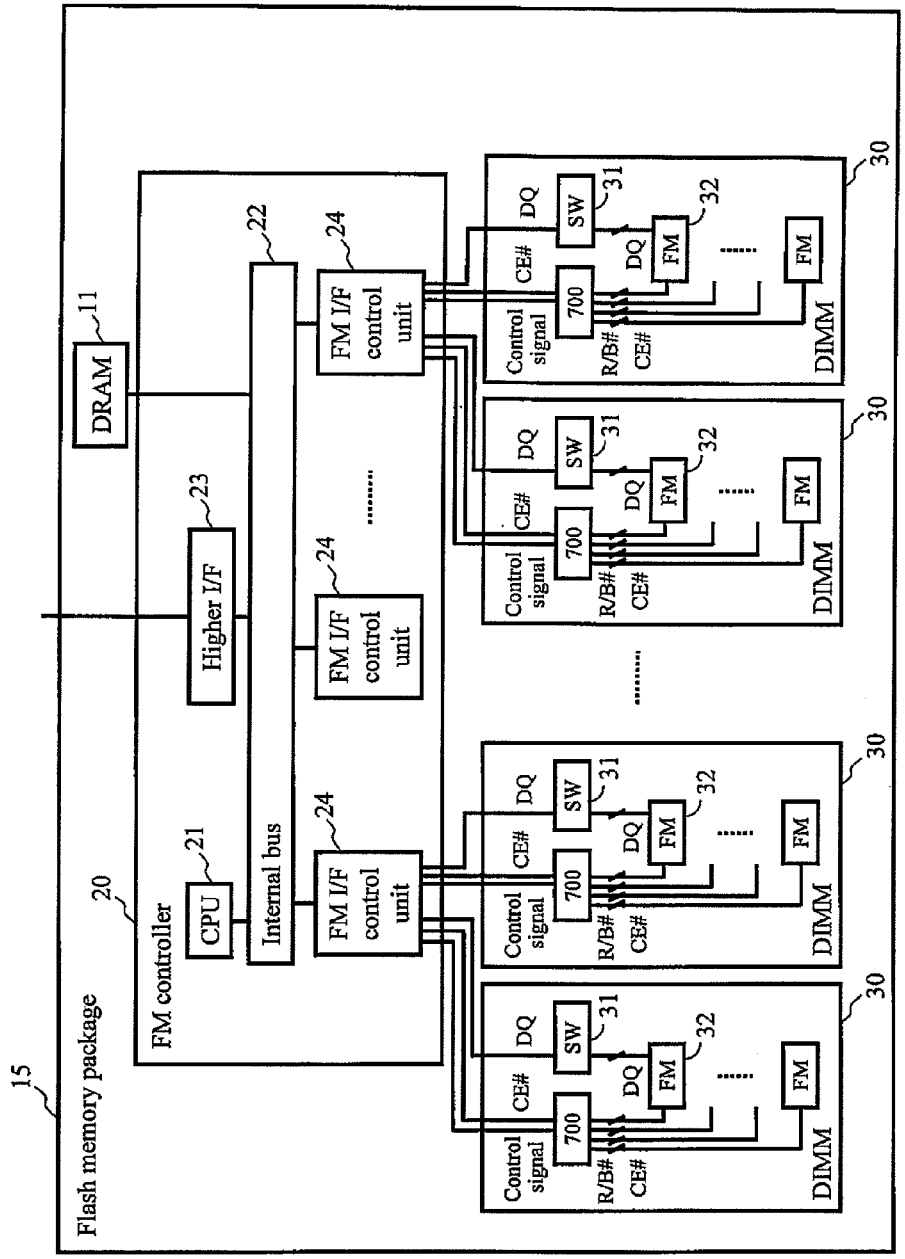
FIG. 11 is an example of a configuration of a flash package according to Example 5 of the present invention.

The signal transmission system of the present invention is applicable to the following calculator system. FIG. 10 is an example of a configuration of a calculator system including a storage system, and FIG. 11 is an example of a flash package which is a storage device of the storage system in FIG. 10.

The calculator system includes a plurality of computers 10 and a storage system 1. The computers 10 and the storage system 1 are connected via a communication network such as an SAN (Storage Area Network) 12.

The storage system 1 includes a storage controller 2 and a storage device group 14 connected to the storage controller 2. The storage device group 14 may be formed including various storage media or may be formed with storage media of the same type. In the present example, the storage device group 14 includes a plurality of flash packages 15.

The storage controller 2 includes a communication interface device, a storage device and a control device connected to the communication device and the storage device. The storage controller 2 includes, for example, an SAN interface (I/F) 6 and disk interface (I/F) 7 as a communication interface device. The SAN interface 6 is connected to an SAN 12 and the disk interface 7 is connected to the storage device group 14.

The storage controller 2 includes, for example, a memory 4 and a cache memory 5 as a storage device. Also, the storage controller 2 includes, for example, a CPU 3 as a control device. The control device may include a dedicated hardware circuit to perform predetermined processing (such as compression, decompression, encryption and decryption), in addition to a processor like the CPU 3.

The memory 4 stores various programs to manage the storage system 1 by the storage controller 2, and information. The CPU 3 can perform predetermined processing by executing the programs based on the information stored in the memory 4.

The cache memory 5 is normally a volatile memory such as a DRAM (Dynamic Random Access Memory). The cache memory 5 temporarily stores data written into part of the storage device group 14 and data read from the storage device group 14. For example, the storage controller 2 accepts a writing request from the computer 10, writes data corresponding to the write request into the cache memory 5 and completes the write request (e.g. transmits a completion report for the writing request to the computer 10).

The storage device group 14 includes a RAID (Redundant Array of Independent (or Inexpensive) Disks) group. The RAID group stores data according to a predetermined RAID level. Based on the storage space of the RAID group, a logical volume (hereinafter referred to as "VOL") is created. Regarding the VOL, there is a VOL type provided to the computer 10 and other VOL types. The former VOL is designated by an I/O request from the computer 10. The latter VOL is, for example, a component of a pool including a storage area assigned to a virtual VOL (i.e. VOL according to thin provisioning) provided to the computer 10.

For example, as a RAID group, the storage device group 14 is formed with the plurality of flash packages 15. A configuration of the flash packages 15 will be explained using FIG. 11.

The flash package 15 includes a plurality of FM (Flash Memory) chips 32 and an FM controller 20 connected thereto. The FM chip 32 is formed with, for example, a plurality of physical blocks. Each physical block is formed with a plurality of physical pages. The FM chip 32 is, for example, an NAND-type flash memory. Each cell of the FM chip 32 may be an SLC (Single Level Cell) or an MLC (Multi Level Cell).

The FM controller 20 includes a communication interface device, a storage device and a control device connected to the communication interface device and the storage device. The FM controller 20 includes, for example, a higher interface (I/F) 23 and a plurality of FM interface (I/F) control units 24 as a communication interface device. Also, the FM controller 20 includes, for example, a DRAM 11 as a storage device. Also, the FM controller 20 includes, for example, a CPU 21 as a control device.

The FM controller 20 is connected to the DRAM 11 via an internal bus 22. The DRAM 11 stores various programs to manage the flash package 15, and information. The CPU 21 can realize various functions by executing the programs based on the information stored in the DRAM 11.

The FM interface control unit 24 is connected to an SW (Switch) 31 and the SW 31 is connected to a plurality of FM chips 32 mounted on the DIMM board 30. The FM interface control unit 24 independently controls the plurality of FM chips using a CE# signal. The FM interface control unit 24 operates in response to the reading/writing request from the CPU 21. In the reading/writing request, a physical address (PBA (Physical Block Address)) of the reading source or writing destination area is designated.

The FM interface control unit 24 calculates a physical block and physical page of the reading source or writing destination from this PBA, and performs reading/writing processing with respect to the calculated physical block and physical page. Also, the FM interface control unit 24 includes an ECC (Error Correction Code) generation circuit and an ECC correction circuit. At the time of the writing of data, in a buffer, the ECC generation circuit generates an ECC with respect to compression data, and the compression data and the ECC are written in the FM chip 32. Also, at the time of the reading of data, compression data (e.g. reading data) from the FM chip 32 is checked in the ECC correction circuit and, in a case in which a data loss is detected, the compression data is corrected in the ECC correction circuit.

The above examples are applicable to the signal transmission system between the FM interface control unit 24 and the FM chip 32 in FIG. 11. The FM interface control unit 24 includes an encode circuit that encodes a CE# signal. Also, the semiconductor device 700 is arranged between the FM interface control unit 24 and the FM chip 32. The semiconductor device 700 is mounted together with the FM chip 32 on the DIMM board 30.

The semiconductor device 700 has the same function as in the above examples. That is, the semiconductor device 700 includes (1) a decode circuit that decodes a CE# signal encoded in the FM interface control unit 24, and (2) a control circuit that controls the CE# signal by an R/B# signal output from the FM chip 32 and, in a case in which a chip selected by the CE# signal is in a busy state, reports the busy state to the FM interface control unit 24 by a control signal.

Also, the SW 31 corresponds to the switch circuit 800 in FIG. 7. The FM interface control unit 24 includes a circuit that outputs a control signal to control a switch in the SW 31. By this control signal, it is possible to control which signal line of DQ signal is selected in the SW 31. Naturally, as illustrated in FIG. 10, the SW 31 may be provided in the semiconductor device 700 such that a control signal for controlling the switch of the SW 31 is generated in the semiconductor device 700.

According to the present example, it is effective to realize a low cost of the signal transmission system and further a large capacity and high-density mounting by connection of a flash memory device in a calculator system such as a storage system.

Also, the above examples can be applied to a case in which a flash memory (FM) is used in the memory 4 or the cache memory 5 in the storage controller 2. For example, the above examples can be applied to the signal transmission system between the CPU 3, which controls these memories 4 and 5, and the memories 4 and 5.

Also, the present invention is not limited to the above examples and includes various variation examples. For example, the above examples give a specific explanation to describe the present invention in an easily understood manner, and are not necessarily limited to what includes all explained components. Also, it is possible to replace part of the configuration of a certain example with the configuration of another example, and it is possible to add the configuration of a certain example to the configuration of another example. Also, regarding part of the configuration of each example, it is possible to add, delete or replace a certain configuration.

Also, signal wires and the element of each configuration required for explanation are illustrated, and it is not always true that all signal wires and the element of each configuration are provided on products. Actually, a case is possible where there are a plurality of types of signal wire topologies connecting configurations and a plurality of elements of configurations.

REFERENCE SIGNS LIST

1 Storage system
2 Storage controller
3 CPU
4 Memory
5 Cache memory
6 SAN interface
7 Disk interface
10 Computer
11 DRAM
14 Storage device group
15 Flash package
20 FM controller
21 CPU
22 Internal bus
23 Higher interface
24 FM interface control unit (semiconductor memory control unit)
30 DIMM board
32 FM chip (semiconductor memory)
100 Board
200 Memory controller
201 Circuit
300 Flash memory (semiconductor memory)
400 Encode circuit
500 Decode circuit
600 Control circuit
700 Semiconductor device
800 Switch circuit
900 DIMM board
1000 DIMM connector
1100 Circuit
1101 First OR circuit
1102 Second OR circuit

The invention claimed is:

1. A signal transmission system connecting a memory controller and a plurality of semiconductor memories, comprising:
   a semiconductor device arranged between the memory controller and the plurality of semiconductor memories,
   wherein the semiconductor device comprises a control circuit, and
   wherein the control circuit receives from the memory controller a first signal for selecting a chip which is a transmission destination, and receives from the semiconductor memory a second signal for notifying an operation state of the chip, and
   wherein the control circuit controls whether or not the first signal can be transmitted to the semiconductor memory in response to the operation state of the chip of the semiconductor memory, and transmits to the memory controller a third signal indicating a result as to whether or not the first signal can be transmitted to the semiconductor memory.

2. The signal transmission system according to claim 1, wherein the memory controller comprises a first circuit that encodes the first signal, and the semiconductor device comprises a second circuit that decodes the first signal encoded by the first circuit, and
   wherein based on the second signal for notifying the operation state of the chip from the semiconductor memory and the first signal decoded by the second circuit, the control circuit controls whether or not the first signal can be transmitted to the semiconductor memory in response to the operation state of the chip of the semiconductor memory, and transmits to the memory controller the third signal indicating the result as to whether or not the first signal can be transmitted to the semiconductor memory.

3. The signal transmission system according to claim 2, further comprising a switch circuit that is arranged between the memory controller and the plurality of semiconductor memories, and switches a data signal.

4. The signal transmission system according to claim 3, wherein the memory controller comprises a circuit that transmits a control signal for controlling the switch of the data signal to the switch circuit.

5. The signal transmission system according to claim 3, wherein the switch circuit is mounted in the semiconductor device, and the switch circuit controls the switch of the data signal by a control signal generated based on the first signal.

6. The signal transmission system according to claim 3, wherein the plurality of semiconductor memories and the switch circuit are mounted on a DIMM board.

7. The signal transmission system according to claim 1, wherein the semiconductor device is mounted on a DIMM board.

8. The signal transmission system according to claim 1, wherein the semiconductor memory is an NAND-type flash memory, the first signal is a signal for selecting a chip for the NAND-type flash memory, and the second signal is a ready busy signal for notifying a chip operation state.

9. A storage system comprising a storage controller and a storage device group comprising a plurality of semiconductor memory packages,
wherein the semiconductor memory package comprises a semiconductor memory control unit, a plurality of semiconductor memories and a semiconductor device arranged between the semiconductor memory control unit and the plurality of semiconductor memories,
wherein the semiconductor device comprises a control circuit, and
wherein the control circuit receives from the semiconductor memory control unit a first signal for selecting a chip which is a transmission destination, and receives from the semiconductor memory a second signal for notifying an operation state of the chip, and
wherein the control circuit controls whether or not the first signal can be transmitted to the semiconductor memory in response to the operation state of the chip of the semiconductor memory, and transmits to the semiconductor memory control unit a third signal indicating a result as to whether or not the first signal can be transmitted to the semiconductor memory.

10. The storage system according to claim 9, further comprising a switch circuit that is arranged between the semiconductor memory control unit and the plurality of semiconductor memories, and switches a data signal.

11. The storage system according to claim 10, wherein the semiconductor memory control unit comprises a circuit that transmits a control signal for controlling the switch of the data signal to the switch circuit.

12. The storage system according to claim 10, wherein the switch circuit is mounted in the semiconductor device, and the switch circuit controls the switch of the data signal by a control signal generated based on the first signal.

13. The storage system according to claim 10, wherein the plurality of semiconductor memories and the switch circuit are mounted on a DIMM board.

14. The storage system according to claim 9, wherein the semiconductor device is mounted on a DIMM board.

15. The storage system according to claim 9, wherein the semiconductor memory is an NAND-type flash memory, the first signal is a signal for selecting a chip for the NAND-type flash memory, and the second signal is a ready busy signal for notifying a chip operation state.

* * * * *